United States Patent
Yao et al.

(10) Patent No.: US 10,930,788 B2
(45) Date of Patent: Feb. 23, 2021

(54) DISPLAY PANEL AND MANUFACTURING METHOD THEREOF, AND DISPLAY DEVICE

(71) Applicant: BOE TECHNOLOGY GROUP CO., LTD., Beijing (CN)

(72) Inventors: Qi Yao, Beijing (CN); Zhanfeng Cao, Beijing (CN); Feng Zhang, Beijing (CN); Haixu Li, Beijing (CN); Shengguang Ban, Beijing (CN); Zhiyong Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 16/331,092

(22) PCT Filed: Mar. 15, 2018

(86) PCT No.: PCT/CN2018/079191
§ 371 (c)(1),
(2) Date: Mar. 6, 2019

(87) PCT Pub. No.: WO2018/223745
PCT Pub. Date: Dec. 13, 2018

(65) Prior Publication Data
US 2019/0207039 A1    Jul. 4, 2019

(30) Foreign Application Priority Data
Jun. 8, 2017 (CN) .......... 201710427881.9

(51) Int. Cl.
*H01L 29/04* (2006.01)
*H01L 31/036* (2006.01)
(Continued)

(52) U.S. Cl.
CPC .... *H01L 29/78633* (2013.01); *H01L 27/1222* (2013.01); *H01L 29/41733* (2013.01);
(Continued)

(58) Field of Classification Search
CPC .......... H01L 27/1222; H01L 29/78633; H01L 29/41733; H01L 29/42384; H01L 29/66757; H01L 29/78675
(Continued)

(56) References Cited

U.S. PATENT DOCUMENTS

| 2008/0111125 A1 | 5/2008 | Kim et al. |
| 2013/0056741 A1 | 3/2013 | Harumoto et al. |

(Continued)

FOREIGN PATENT DOCUMENTS

| CN | 1713056 A | 12/2005 |
| CN | 101179092 A | 5/2008 |

(Continued)

OTHER PUBLICATIONS

International Search Report and Written Opinion issued in International Patent Application No. PCT/CN2018/079191, dated May 24, 2018; with English translation.

(Continued)

*Primary Examiner* — Sue A Purvis
(74) *Attorney, Agent, or Firm* — McDermott Will & Emery LLP

(57) ABSTRACT

A display panel includes a base substrate, and thin film transistors positioned on the base substrate. Each thin film transistor includes a polysilicon layer. The display panel further includes a light-shielding layer for blocking ultraviolet (UV) light that is located at a side of the polysilicon layer away from the base substrate. An orthographic projection of the polysilicon layer on the substrate is in a range of an orthographic projection of the light-shielding layer on the substrate.

12 Claims, 5 Drawing Sheets

(51) Int. Cl.
  *H01L 21/00*    (2006.01)
  *H01L 29/786*   (2006.01)
  *H01L 29/66*    (2006.01)
  *H01L 27/12*    (2006.01)
  *H01L 29/423*   (2006.01)
  *H01L 29/417*   (2006.01)

(52) U.S. Cl.
  CPC .. *H01L 29/42384* (2013.01); *H01L 29/66757* (2013.01); *H01L 29/78675* (2013.01)

(58) Field of Classification Search
  USPC .............................................. 257/72; 438/29
  See application file for complete search history.

(56) References Cited

U.S. PATENT DOCUMENTS

| | | | |
|---|---|---|---|
| 2013/0187162 A1* | 7/2013 | Miwa | H01L 29/66757 257/57 |
| 2016/0126302 A1 | 5/2016 | Cheng et al. | |
| 2016/0197128 A1 | 7/2016 | Chen et al. | |
| 2016/0365366 A1 | 12/2016 | Zhao et al. | |
| 2016/0372532 A1 | 12/2016 | Song et al. | |
| 2017/0012094 A1 | 1/2017 | Lee | |
| 2018/0090521 A1 | 3/2018 | Tian et al. | |
| 2018/0204769 A1 | 7/2018 | Xu et al. | |
| 2019/0207039 A1 | 7/2019 | Yao et al. | |

FOREIGN PATENT DOCUMENTS

| | | | | |
|---|---|---|---|---|
| CN | 104167365 A | * | 11/2014 | ............ H01L 21/34 |
| CN | 104167365 A | | 11/2014 | |
| CN | 104300085 A | | 1/2015 | |
| CN | 104362157 A | | 2/2015 | |
| CN | 104393024 A | | 3/2015 | |
| CN | 104659066 A | | 5/2015 | |
| CN | 104752470 A | * | 7/2015 | |
| CN | 104752470 A | | 7/2015 | |
| CN | 105097831 A | | 11/2015 | |
| CN | 105470196 A | | 4/2016 | |
| CN | 106356407 A | | 1/2017 | |
| CN | 107248373 A | | 10/2017 | |
| JP | 2011-171187 A | | 9/2011 | |

OTHER PUBLICATIONS

Chinese First Office Action issued in Chinese Patent Application No. 201710427881.9, dated Jan. 3, 2019; with English translation.
Chinese Second Office Action issued in Chinese Patent Application No. 201710427881.9, dated Jul. 8, 2019; with English translation.

* cited by examiner

DISPLAY PANEL AND MANUFACTURING METHOD THEREOF, AND DISPLAY DEVICE

CROSS-REFERENCE TO RELATED APPLICATION

This application is a national phase entry under 35 USC 371 of International Patent Application No. PCT/CN2018/079191 filed on Mar. 15, 2018, which claims priority to Chinese Patent Application No. 201710427881.9, submitted to Chinese Patent Office on Jun. 8, 2017, titled "DISPLAY PANEL AND MANUFACTURING METHOD THEREOF, AND DISPLAY DEVICE", which are incorporated herein by reference in their entirety.

TECHNICAL FIELD

The present disclosure relates to the field of display technologies, and in particular, to a display panel and a method of manufacturing the same, and a display device.

BACKGROUND

A display panel based on low temperature polysilicon (LTPS) technology includes a base substrate, and thin film transistors, a pixel defining layer, photo spacers, and light-emitting structures formed on the base substrate. The pixel defining layer and the photo spacers can be manufactured separately, or manufactured synchronously by adopting a half tone (HF) technology.

SUMMARY

Some embodiments of the present disclosure provide a display panel, which includes a base substrate, thin film transistors located on the base substrate, and light-emitting structures located on a side of the thin film transistors away from the base substrate. Each thin film transistor includes a polysilicon layer disposed between a corresponding light-emitting structure and the base substrate. The display panel further includes a light-shielding layer for blocking ultraviolet (UV) light that is located between the polysilicon layer and the light-emitting structures, and an orthographic projection of the light-shielding layer on the base substrate covers an orthographic projection of the polysilicon layer on the base substrate.

In some embodiments of the present disclosure, the light-shielding layer is an amorphous silicon layer.

In some embodiments of the present disclosure, a thickness of the amorphous silicon layer is in a range of about 600 Å~about 1500 Å.

In some embodiments of the present disclosure, each thin film transistor further includes a gate insulating layer disposed on a surface of the polysilicon layer away from the base substrate, and a gate electrode disposed on a surface of the gate insulating layer away from the polysilicon layer. The light-shielding layer is located between the gate electrode and the light-emitting structures. The thin film transistor includes a source electrode and a drain electrode located on a surface of the light-shielding layer away from the gate electrode. The gate electrode is insulated from the source electrode, the gate electrode is insulated from the drain electrode, the source electrode or the drain electrode is connected to an electrode of a corresponding light-emitting structure, and the source electrode and the drain electrode are electrically connected to the polysilicon layer through the light-shielding layer and the gate insulating layer.

In some embodiments of the present disclosure, the display panel further includes at least one intermediate layer located between the light-shielding layer and both the source electrode and the drain electrode. The source electrode and the drain electrode are electrically connected to the polysilicon layer through the at least one intermediate layer, the light-shielding layer, and the gate insulating layer.

In some embodiments of the present disclosure, the display panel further includes an interlayer insulating layer located between the gate insulating layer and the light-shielding layer. The interlayer insulating layer covers the gate electrode and the gate insulating layer. The source electrode and the drain electrode are electrically connected to the polysilicon layer through the interlayer insulating layer.

In some embodiments of the present disclosure, the display panel further includes a planarization layer located between the light-shielding layer and the light-emitting structure. The planarization layer covers the source electrode, the drain electrode and the light-shielding layer, and an electrode of each light-emitting structure is electrically connected to a corresponding source electrode or a corresponding drain electrode through the planarization layer.

In some embodiments of the present disclosure, the display panel further includes a buffer layer located between the polysilicon layer and the base substrate.

In some embodiments of the present disclosure, the base substrate is a glass substrate or a flexible substrate.

Some embodiments of the present disclosure provide a method of manufacturing a display panel, which can be applied to the display panel according to above aspect of the present disclosure. The method includes: providing a base substrate; forming thin film transistors including polysilicon layers and a light-shielding layer for blocking UV light on the base substrate, wherein the light-shielding layer is located on a side of the polysilicon layers away from the base substrate, and an orthographic projection of the light-shielding layer on the base substrate covers an orthographic projection of each polysilicon layer on the base substrate; and forming light-emitting structures on a side of the light-shielding layer away from the polysilicon layer.

In some embodiments of the present disclosure, the step of forming thin film transistors including polysilicon layers and a light-shielding layer for blocking UV light on the base substrate includes: forming the polysilicon layers on the base substrate; forming a gate insulating layer on a surface of the polysilicon layers away from the base substrate; forming gate electrodes on a surface of the gate insulating layer away from the polysilicon layers; forming an interlayer insulating layer and a light-shielding layer for blocking UV light on the surface of the gate insulating layer away from the polysilicon layers by a same patterning process, wherein the interlayer insulating layer covers the gate electrodes and the gate insulating layer, and the light-shielding layer is located on a surface of the interlayer insulating layer away from the gate insulating layer; and forming source electrodes and drain electrodes on a surface of the light-shielding layer away from the interlayer insulating layer, wherein each gate electrode is insulated from a corresponding source electrode, the gate electrode is insulated from a corresponding drain electrode, and the source electrode and the drain electrode are electrically connected to a corresponding polysilicon layer through the light-shielding layer, the interlayer insulating layer, and the gate insulating layer.

In some embodiments of the present disclosure, after the step of forming source electrodes and drain electrodes on a surface of the light-shielding layer away from the interlayer insulating layer, the method further includes: forming a planarization layer on a surface of the light-shielding layer away from the interlayer insulating layer, wherein the planarization layer covers the source electrodes, the drain electrodes, and the light-shielding layer; and the step of forming light-emitting structures on a side of the light-shielding layer away from the polysilicon layers includes: forming light-emitting structures on a surface of the planarization layer away from the light-shielding layer, wherein an electrode of each light-emitting structure is electrically connected to a corresponding source electrode or a corresponding drain electrode through the planarization layer.

In some embodiments of the present disclosure, before the step of forming thin film transistors including polysilicon layers and a light-shielding layer for blocking UV light on the base substrate, the method of manufacturing the display panel further includes: forming a buffer layer on the base substrate.

Some embodiments of the present disclosure provide a display device, which includes the display panel according to the above aspect of the present disclosure.

BRIEF DESCRIPTION OF THE DRAWINGS

In order to describe technical solutions in embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

In order to make the above objectives, features and advantages of the present disclosure more understandable, the technical solutions in embodiments of the present disclosure will be described clearly and completely with reference to the accompanying drawings in embodiments of the present disclosure. Obviously, the described embodiments are merely some but not all of embodiments of the present disclosure. All other embodiments obtained on the basis of the embodiments of the present disclosure by a person of ordinary skill in the art without paying any creative effort shall be included in the protection scope of the present disclosure.

Usually, in a manufacturing process of a display panel, a pixel defining layer and photo spacers are formed after anode electrodes of light-emitting structures and thin film transistors are formed. Next, the formed pixel defining layer and the photo spacers are exposed to UV light to form aperture regions, and then light-emitting layers of the light-emitting structures are formed in the aperture regions respectively. Since the pixel defining layer and the photo spacers are both formed of a thick organic resin material, a large amount of UV light and a long exposure time are required when exposing the pixel defining layer and the photo spacers to UV light. In this case, the UV light will have high energy. Therefore, when the UV light passes through the pixel defining layer and the photo spacers and is irradiated to the polysilicon layers in the thin film transistors under the pixel defining layer and the photo spacers, the polysilicon layers will be adversely affected. As a result, a problem of threshold voltage drift will occur in the thin film transistors, and thus electrical properties of the thin film transistors may be affected. To repair the adverse effects caused by the UV light, it is necessary to perform a long annealing process in a final step of the manufacturing process of the display panel. However, since the annealing process is an extra step in the manufacturing process of the display panel, it will lead to an increase in production time and a decrease in productivity. In addition, the annealing process will also adversely affect a performance of a resin material, and in turn affect a performance of the display panel.

Figure 1:
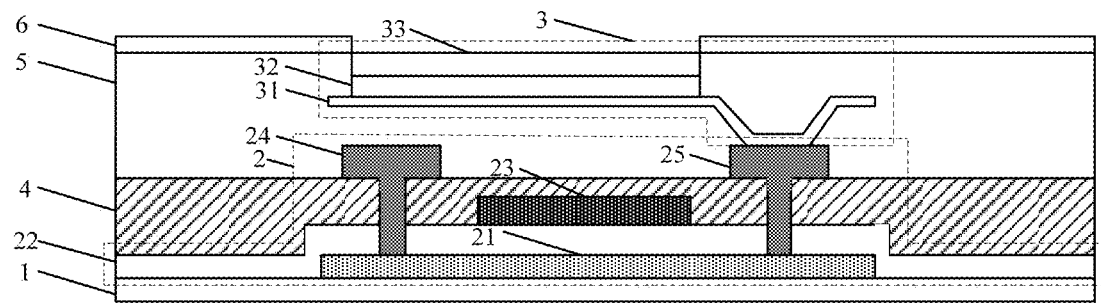
FIG. 1 is a schematic diagram showing a partial structure of a display panel according to some embodiments of the present disclosure.

In order to prevent the UV light from adversely affecting the polysilicon layers, and thereby avoid the problem of threshold voltage drift of the thin film transistors, some embodiments of the present disclosure provide a display panel. As shown in FIG. 1, the display panel includes a base substrate 1, thin film transistors 2 disposed on the base substrate 1, and light-emitting structures 3 disposed on a side of the thin film transistors 2 away from the base substrate 1. Each thin film transistor 2 includes a polysilicon layer 21 located between a corresponding light-emitting structure 3 and the base substrate 1. The display panel further includes a light-shielding layer 4 for blocking UV light that is located between the polysilicon layer 21 and the light-emitting structures 3. An orthographic projection of the light-shielding layer 4 on the base substrate 1 covers an orthographic projection of the polysilicon layer 21 on the base substrate 1.

In some embodiments of the present disclosure, as shown in FIG. 1, each light-emitting structure 3 includes an anode electrode 31, a light-emitting layer 32, and a cathode electrode 33. The anode electrode 31 is electrically connected to a corresponding thin film transistor 2. In some embodiments of the present disclosure, the display panel further includes a pixel defining layer 5 disposed on surfaces of anode electrodes 31 away from the thin film transistor 2, and photo spacers 6 disposed on a surface of the pixel defining layer 5 away from the anode electrodes 31. The pixel defining layer 5 and the photo spacers 6 are provided with aperture regions, which are formed by exposing the pixel defining layer 5 and the photo spacers 6. The display panel further includes light-emitting layers 32 each located on a surface of a corresponding anode electrode 31 away from a corresponding thin film transistor 2 and located inside a corresponding aperture region, and cathode electrodes 33 each located on a surface of a corresponding light-emitting layer 32 away from the anode electrode 31 and located inside a corresponding aperture region.

The display panel provided by the embodiments of the present disclosure includes the light-shielding layer 4 for blocking UV light that is located between the polysilicon layers 21 of the thin film transistors 2 and the light-emitting structures 3. When the pixel defining layer 5 and the photo spacers 6 are subsequently exposed to UV light, due to a shielding effect of the light-shielding layer 4, the UV light cannot be transmitted to the polysilicon layers 21 of the thin film transistors 2. As a result, the UV light may be prevented from adversely affecting the polysilicon layers 21, and the problem of threshold voltage drift of the thin film transistors 2 may be avoided. In addition, since the light-shielding layer 4 is able to prevent the UV light from being transmitted to the polysilicon layers 21, there is no need to add the annealing process. As a result, the production time of the display panel may be shortened and the productivity may be improved. Moreover, the adverse effect of the annealing process on the performance of the display panel may be avoided.

In some embodiments of the present disclosure, the light-shielding layer 4 is an amorphous silicon layer. A wavelength of the UV light is short, and an amorphous silicon material absorbs short-wavelength light. By utilizing this property of the amorphous silicon material, the light-shielding layer 4 made of an amorphous silicon material may effectively block the UV light, thereby reducing the UV light transmitted to the polysilicon layer 21.

Figure 2:
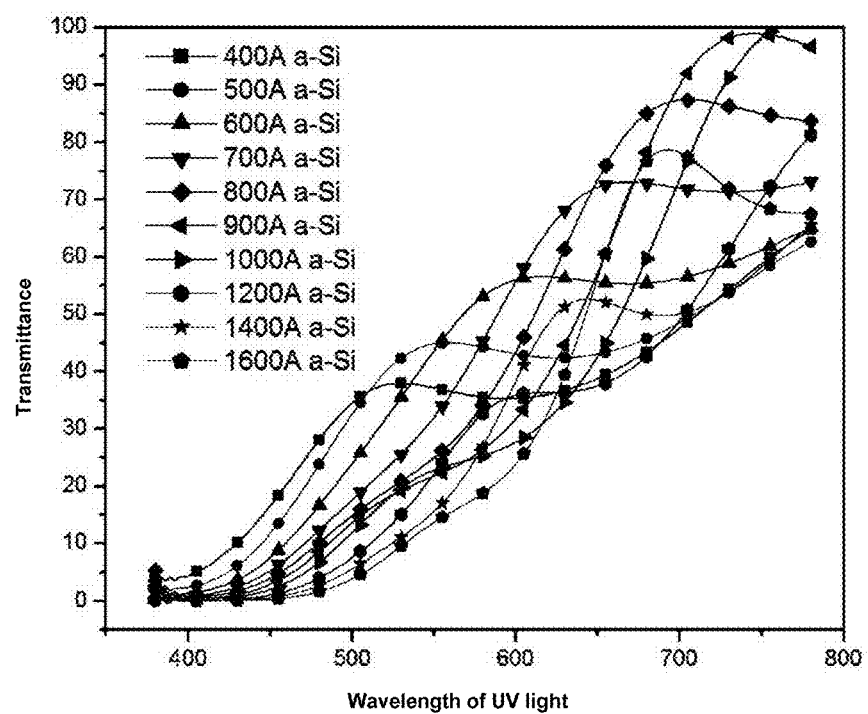
FIG. 2 is a schematic diagram showing an UV light transmittance according to some embodiments of the present disclosure.

Referring to FIG. 2, which shows a transmittance of UV light of different wavelengths in an amorphous silicon layer of different thicknesses, it is known that for UV light with a wavelength below 400 nm, the amorphous silicon layer has a strong blocking effect on the UV light when the thickness of the amorphous silicon layer is in a range of about 600 Å~about 1500 Å. Hence, in some embodiments of the present disclosure, the thickness of the amorphous silicon layer is in a range of about 600 Å~about 1500 Å.

With continued reference to FIG. 1, the thin film transistors 2 further includes a gate insulating layer 22, gate electrodes 23, source electrodes 24, and drain electrodes 25.

In some embodiments of the present disclosure, the gate insulating layer 22 is formed on surfaces of the polysilicon layers 21 away from the base substrate 1 by a chemical vapor deposition process, so that the gate insulating layer covers the polysilicon layers 21. The gate electrodes 23 each may be formed on a surface of the gate insulating layer 22 away from a corresponding polysilicon layer 21 by a sputtering process. The light-shielding layer 4 is disposed between the gate electrodes 23 and the light-emitting structures 3, and the source electrodes 24 and the drain electrodes 25 are formed on a surface of the light-shielding layer 4 away from the gate electrodes 23 by a sputtering process. Each gate electrode 23 is insulated from a corresponding source electrode 24, and the gate electrode 23 is insulated from a corresponding drain electrode 25. The source electrode 24 or the drain electrode 25 is electrically connected to an electrode, i.e. the anode electrode 31, of a corresponding light-emitting structure 3, and the source electrode 24 and the drain electrode 25 are respectively electrically connected to a corresponding polysilicon layer 21 through the light-shielding layer 4 and the gate insulating layer 22.

Figure 3:
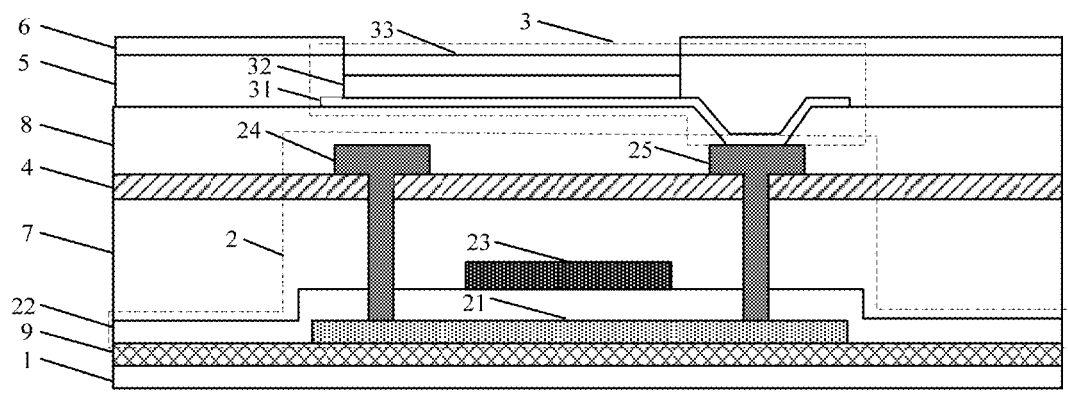
FIG. 3 is a schematic diagram showing a partial structure of another display panel according to some embodiments of the present disclosure.

In addition, as shown in FIG. 3, in some embodiments of the present disclosure, the display panel further includes an interlayer insulating layer 7 formed between the gate insulating layer 22 and the light-shielding layer 4 by a chemical vapor deposition process. The interlayer insulating layer 7 covers the gate electrodes 23 and the gate insulating layer 22, and a source electrode 24 and a drain electrode 25 are respectively electrically connected to a corresponding polysilicon layer 21 through the light-shielding layer 4 and the interlayer insulating layer 7.

Figure 8:
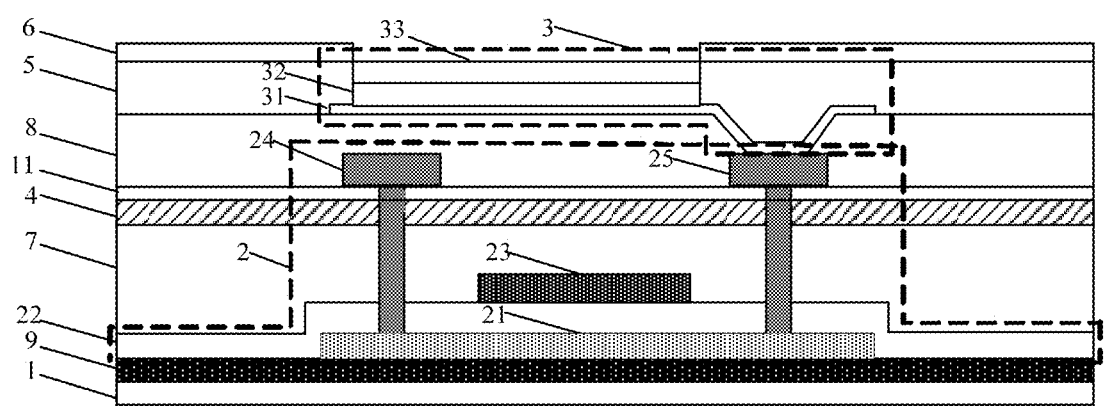
FIG. 8 is a schematic diagram showing a partial structure of yet another display panel according to some embodiments of the present disclosure.

In some embodiments of the present disclosure, as shown in FIG. 8, the display panel further includes at least one intermediate layer 11 located between the light-shielding layer 4 and both the source electrodes 24 and the drain electrodes 25. The intermediate layer 11 is made of, for example, $SiN_x$, SiON, etc. The intermediate layer 11 is formed, for example, by a chemical vapor deposition process.

Figure 4A:
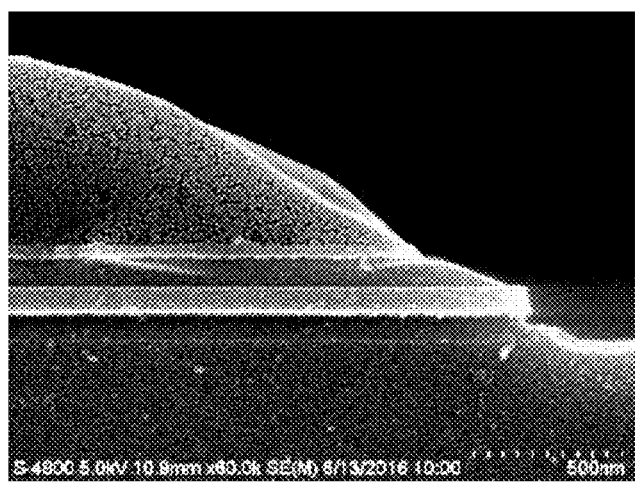
FIG. 4a is a schematic diagram showing properties of a light-shielding layer and an interlayer insulating layer of a display panel according to some embodiments of the present disclosure.
Figure 4B:
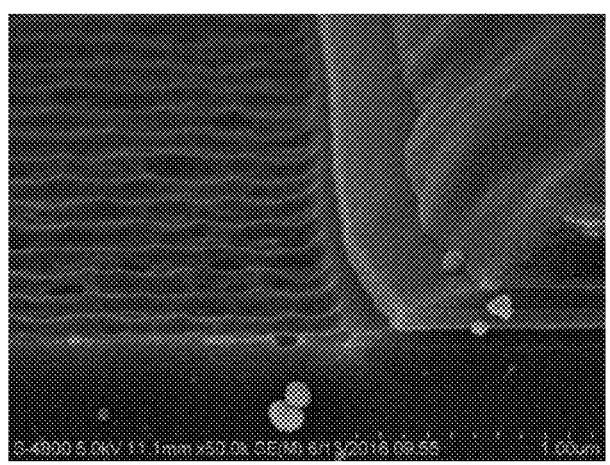
FIG. 4b is a schematic diagram showing properties of a light-shielding layer and an interlayer insulating layer of another display panel according to some embodiments of the present disclosure.

In some embodiments of the present disclosure, in an actual manufacturing process of the display panel, the light-shielding layer 4 and the interlayer insulating layer 7 are formed by using only one mask and by performing a single patterning process, such as a dry etching process. With this approach, the manufacturing process may be simplified and a manufacturing cost may be reduced. In addition, both the light-shielding layer 4 and the interlayer insulating layer 7 formed by the dry etching process may have good properties. For example, as shown in FIG. 4a, an etched pattern of the light-shielding layer 4 and the interlayer insulating layer 7 is normal, and as shown in FIG. 4b, the etched pattern of the light-shielding layer 4 and the interlayer insulating layer 7 has a good linearity.

It will be further noted that, the light-shielding layer 4 is used for blocking UV light and preventing the UV light from being transmitted to the polysilicon layers 21. Therefore, in some embodiments of the present disclosure, the light-shielding layer 4 is only disposed on a side of the polysilicon layers 21 away from the base substrate 1. In some examples, in a case where the interlayer insulating layer 7 is of a single-layer film structure, the light-shielding layer 4 may be located on a surface of the interlayer insulating layer 7 away from the gate insulating layer 22, or may be located on a surface of the gate insulating layer 22 close to the interlayer insulating layer 7. In another example, in a case where the interlayer insulating layer 7 is of a multi-layer film structure, the light-shielding layer 4 may be located between two adjacent layers of the interlayer insulating layer 7.

Furthermore, in some embodiments of the present disclosure, the display panel further includes a planarization layer 8 formed between the light-shielding layer 4 and the anode electrodes 31 of the light-emitting structures 3 by a photolithographic process. The planarization layer 8 covers the source electrodes 24, the drain electrodes 25, and the light-shielding layer 4. An anode electrode 31 of each light-emitting structure 3 is electrically connected to a corresponding source electrode 24 or a corresponding drain electrode 25 through the planarization layer 8. The planarization layer 8 formed in the display panel may be able to fill depressions on a surface of a film layer, thus realizing smoothing treatment of the surface of the film layer.

If the polysilicon layers 21 are directly formed on the base substrate 1, impurities on the base substrate 1 may contaminate the polysilicon layers 21. Therefore, in some embodiments of the present disclosure, the display panel further includes a buffer layer 9 formed on the base substrate 1 before the polysilicon layers 21 are formed. This is to isolate the base substrate 1 from the polysilicon layers 21, so that contamination of the polysilicon layer 21 by the impurities on the base substrate 1 may be avoided.

In some embodiments of the present disclosure, the base substrate 1 of the display panel is a glass substrate or a flexible substrate. A type of the base substrate 1 may be set according to application situations of the display panel. In some examples, in a case where the base substrate 1 is a flexible substrate, the base substrate 1 may be made of a polyimide material.

Some embodiments of the present disclosure provide a method of manufacturing a display panel, which is applied to the display panel as described in the above embodiments.

Figure 5:
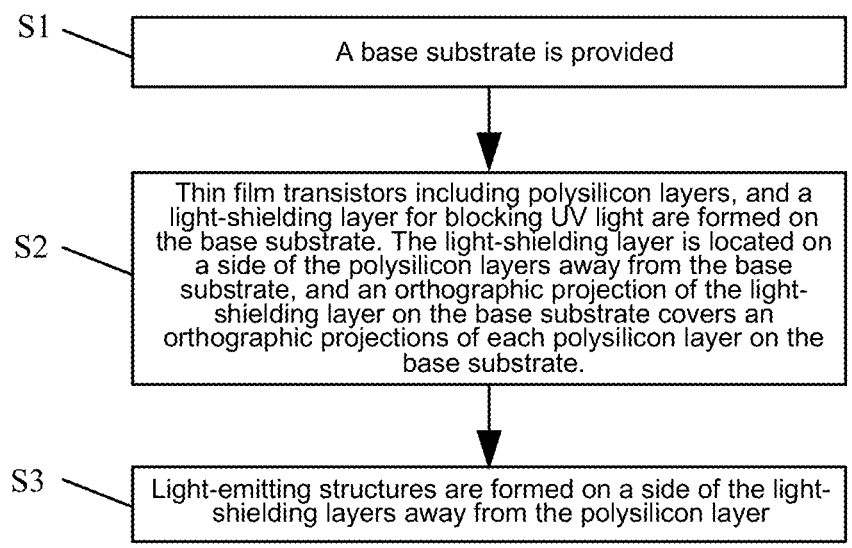
FIG. 5 is a flow chart of a method of manufacturing a display panel according to some embodiments of the present disclosure.

As shown in FIG. 5, the method of manufacturing a display panel includes steps 1-3 (S1-S3).

In step 1 (S1), a base substrate is provided.

In step 2 (S2), thin film transistors including polysilicon layers, and a light-shielding layer for blocking UV light are formed on the base substrate. The light-shielding layer is located on a side of the polysilicon layers away from the base substrate, and an orthographic projection of the light-shielding layer on the base substrate covers an orthographic projections of each polysilicon layer on the base substrate.

In step 3 (S3), light-emitting structures are formed on a side of the light-shielding layers away from the polysilicon layer.

With the method of manufacturing a display panel provided by this embodiment, after the polysilicon layers are formed, the light-shielding layer for blocking UV light is formed on the polysilicon layer. When the pixel defining layer and the photo spacers are subsequently exposed to UV light, due to a shielding effect of the light-shielding layer, the UV light may not be transmitted to the polysilicon layers of the thin film transistors. As a result, the UV light may be prevented from adversely affecting the polysilicon layers, and the problem of threshold voltage drift of the thin film transistors may be avoided. In addition, since the light-shielding layer 4 is able to prevent the UV light from being transmitted to the polysilicon layers 21, there is no need to add an annealing process. As a result, the production time of the display panel may be shortened and the productivity may be improved. Moreover, the adverse effect of the annealing process on the performance of the display panel may be avoided.

Figure 6:
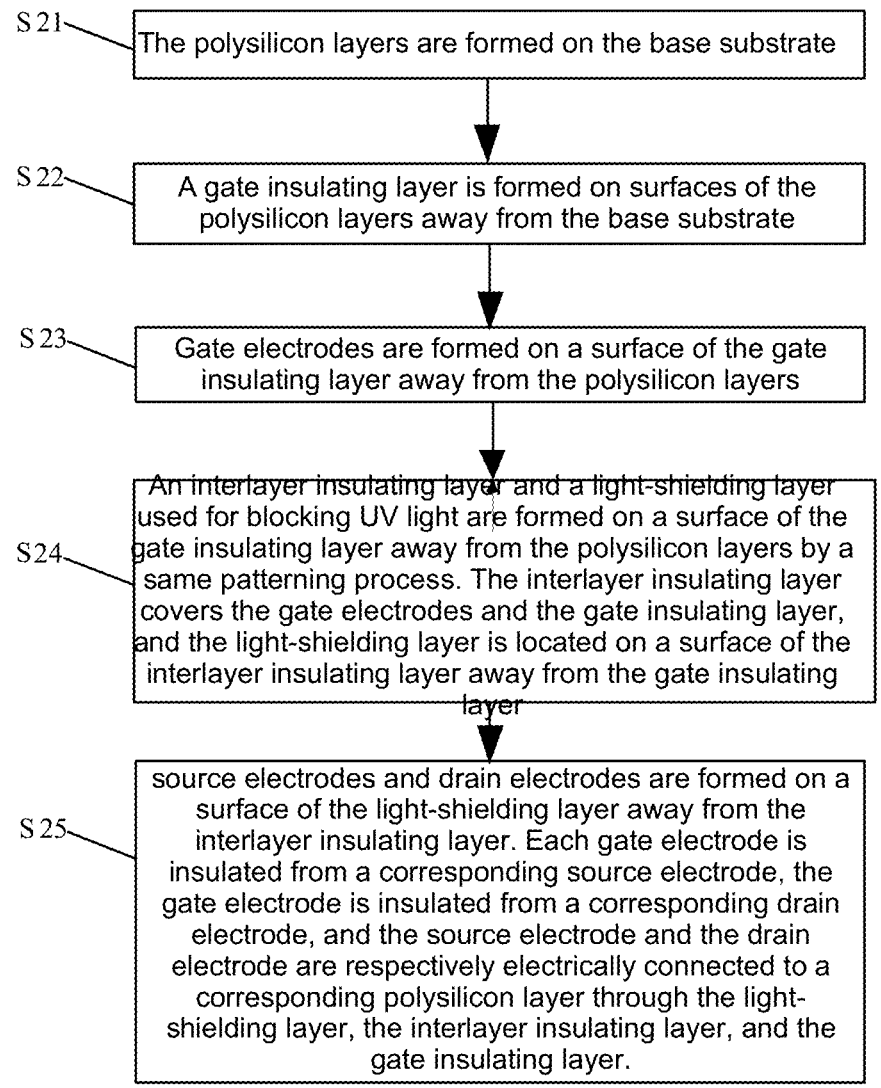
FIG. 6 is a flow chart of another method of manufacturing a display panel according to some embodiments of the present disclosure.

As shown in FIG. 6, in some embodiments of the present disclosure, step 2 (S2) includes steps 21-25 (S21-S25).

In step 21 (S21), the polysilicon layers are formed on the base substrate.

In step 22 (S22), a gate insulating layer is formed on surfaces of the polysilicon layers away from the base substrate.

In step 23 (S23), gate electrodes are formed on a surface of the gate insulating layer away from the polysilicon layers.

In step 24 (S24), an interlayer insulating layer and a light-shielding layer used for blocking UV light are formed on a surface of the gate insulating layer away from the polysilicon layers by a same patterning process. The interlayer insulating layer covers the gate electrodes and the gate insulating layer, and the light-shielding layer is located on a surface of the interlayer insulating layer away from the gate insulating layer.

In some embodiments of the present disclosure, the light-shielding layer is an amorphous silicon layer having a thickness in a range of about 600 Å~about 1500 Å.

The light-shielding layer and the interlayer insulating layer are formed by a single patterning process, which simplifies the manufacturing process. In addition, only one mask is needed to form the light-shielding layer and the interlayer insulating layer, which reduces the manufacturing cost.

In step 25 (S25), source electrodes and drain electrodes are formed on a surface of the light-shielding layer away from the interlayer insulating layer. Each gate electrode is insulated from a corresponding source electrode, the gate electrode is insulated from a corresponding drain electrode, and the source electrode and the drain electrode are respectively electrically connected to a corresponding polysilicon layer through the light-shielding layer, the interlayer insulating layer, and the gate insulating layer.

In some embodiments of the present disclosure, after the step 25 (S25) and before the step 3 (S3), the method of manufacturing a display panel further includes: forming a planarization layer on a surface of the light-shielding layer away from the interlayer insulating layer, wherein the planarization layer covers the source electrodes, the drain electrodes, and the light-shielding layer. The planarization layer formed on the surface of the light-shielding layer away from the interlayer insulating layer may be able to fill depressions on a surface of a film layer, thus realizing smoothing treatment of the surface of the film layer.

In some embodiments of the present disclosure, after forming the planarization layer, the step 3 (S3) includes: forming light-emitting structures on a surface of the planarization layer away from the light-shielding layer, wherein an electrode of each light-emitting structure is electrically connected to a corresponding source electrode or a corresponding drain electrode through the planarization layer.

In addition, in some embodiments of the present disclosure, between the step 1 (S1) and the step 2 (S2), the method of manufacturing a display panel further includes: forming a buffer layer on the base substrate. The buffer layer separates the base substrate from the polysilicon layers, thereby avoiding contamination of the polysilicon layers by the impurities on the base substrate.

In some embodiments of the present disclosure, the base substrate is a rigid substrate or a flexible substrate according to actual application situations of the display panel. In some examples, in a case where the base substrate is a rigid substrate, the base substrate is made of glass. In another example, in a case where the base substrate is a flexible substrate, the base substrate is made of a polyimide material.

Figure 7:
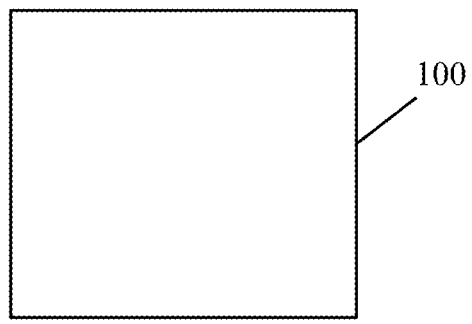
FIG. 7 is a display device according to some embodiments of the present disclosure.

As shown in FIG. 7, some embodiments of the present disclosure provide a display device 100, which includes the display panel as described in the above embodiments.

Since the display device 100 provided in this embodiment includes the display panel as described in the above embodiments, the display device 100 may prevent the UV light from adversely affecting the polysilicon layers, thereby avoiding the problem of threshold voltage drift of the thin film transistors. In addition, since it is not necessary to add an annealing process, a production time of the display device may be shortened, and the productivity may be improved.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display panel, comprising:
   a base substrate, thin film transistors disposed on the base substrate, each thin film transistor comprising a polysilicon layer, a gate electrode, a source electrode and a drain electrode;
a gate insulating layer disposed on a surface of the polysilicon layer away from the base substrate;
a light-shielding layer for blocking ultraviolet (UV) light that is located at a side of the gate insulating layer away from the base substrate, wherein an orthographic projection of the polysilicon layer on the base substrate is in a range of an orthographic projection of the light-shielding layer on the base substrate, wherein the light-shielding layer is an amorphous silicon layer, and a thickness of the amorphous silicon layer is in a range of about 1200 Å~about 1500 Å; and
an interlayer insulating layer located between the gate insulating layer and the light-shielding layer, wherein the interlayer insulating layer covers the gate electrode and the gate insulating layer; and the source electrode and the drain electrode are electrically connected to the polysilicon layer through the interlayer insulating layer, the light-shielding layer, and the gate insulating layer.

2. The display panel according to claim 1, wherein the display panel further comprises a buffer layer located between the polysilicon layer and the base substrate.

3. The display panel according to claim 1, wherein the base substrate is a glass substrate or a flexible substrate.

4. The display panel according to claim 1, further comprising light emitting structures disposed on a side of the thin film transistors away from the base substrate.

5. The display panel according to claim 4, wherein the gate electrode is disposed on a surface of the gate insulating layer away from the polysilicon layer;
the light-shielding layer is located between the gate electrode and the light-emitting structures;
the source electrode and the drain electrode are located on a surface of the light-shielding layer away from the gate electrode, wherein the gate electrode is insulated from the source electrode, the gate electrode is insulated from the drain electrode, the source electrode or the drain electrode is electrically connected to an electrode of a corresponding light-emitting structure, and the source electrode and the drain electrode are electrically connected to the polysilicon layer through the light-shielding layer and the gate insulating layer.

6. The display panel according to claim 5, further comprising at least one intermediate layer located between the light-shielding layer and both the source electrode and the drain electrode, wherein the source electrode and the drain electrode are electrically connected to the polysilicon layer through the at least one intermediate layer, the light-shielding layer, and the gate insulating layer.

7. The display panel according to claim 5, wherein the display panel further comprises a planarization layer located between the light-shielding layer and the light-emitting structures; the planarization layer covers the source electrode, the drain electrode and the light-shielding layer, and an electrode of each light-emitting structure is electrically connected to a corresponding source electrode or a corresponding drain electrode through the planarization layer.

8. A method of manufacturing a display panel, applied to the display panel according to claim 1, comprising:
providing a base substrate; and
forming polysilicon layers on the base substrate, wherein a thickness of the amorphous silicon layer is in a range of about 1200 Å~about 1500 Å;
forming a gate insulating layer on surfaces of the polysilicon layers away from the base substrate;
forming gate electrodes on a surface of the gate insulating layer away from the polysilicon layers;
forming an interlayer insulating layer and a light-shielding layer for blocking UV light on the surface of the gate insulating layer away from the polysilicon layers by a same patterning process, wherein the interlayer insulating layer covers the gate electrodes and the gate insulating layer, and the light-shielding layer is located on a surface of the interlayer insulating layer away from the gate insulating layer; and
forming source electrodes and drain electrodes on a surface of the light-shielding layer away from the interlayer insulating layer, wherein each gate electrode is insulated from a corresponding source electrode, the gate electrode is insulated from a corresponding drain electrode, and the source electrode and the drain electrode are electrically connected to a corresponding polysilicon layer through the light-shielding layer, the interlayer insulating layer, and the gate insulating layer, wherein
the light-shielding layer is located on a side of the interlayer insulating layer away from the base substrate, and an orthographic projection of the light-shielding layer on the base substrate covers an orthographic projection of each polysilicon layer on the base substrate.

9. The method of manufacturing the display panel according to claim 8, wherein after the step of forming source electrodes and drain electrodes on a surface of the light-shielding layer away from the interlayer insulating layer, the method further comprises: forming a planarization layer on a surface of the light-shielding layer away from the interlayer insulating layer, wherein the planarization layer covers the source electrodes, the drain electrodes, and the light-shielding layer; and
the step of forming light-emitting structures on a side of the light-shielding layer away from the polysilicon layers comprises: forming light-emitting structures on a surface of the planarization layer away from the light-shielding layer, wherein an electrode of each light-emitting structure is electrically connected to a corresponding source electrode or a corresponding drain electrode through the planarization layer.

10. The method of manufacturing the display panel according to claim 8, wherein before the step of forming thin film transistors comprising polysilicon layers and a light-shielding layer for blocking UV light on the base substrate, the method further comprises: forming a buffer layer on the base substrate.

11. The method of manufacturing the display panel according to claim 8, wherein after the step of forming thin film transistors comprising polysilicon layers and a light-shielding layer for blocking UV light on the base substrate, the method further comprises: forming light-emitting structures on a side of the light-shielding layer away from the polysilicon layers.

12. A display device, comprising the display panel according to claim 1.

* * * * *